United States Patent [19]

Yamamoto et al.

[11] 4,041,533

[45] Aug. 9, 1977

[54] DELAY CIRCUITRY

[75] Inventors: Katsuhiko Yamamoto, Neyagawa; Kunihiko Hontani, Katano; Hiromu Kitaura, Osaka; Michio Nakamura, Hirakata, all of Japan

[73] Assignee: Matsushita Electric Industrial Co., Ltd., Japan

[21] Appl. No.: 615,084

[22] Filed: Sept. 19, 1975

[30] Foreign Application Priority Data

Dec. 19, 1974 Japan ............................ 49-155700[U]
Dec. 19, 1974 Japan ............................ 49-155701[U]
Feb. 18, 1975 Japan ............................ 50-22727[U]
Sept. 28, 1974 Japan ................................. 49-112177

[51] Int. Cl.² .......................... H04N 5/14; H03B 3/04
[52] U.S. Cl. .................................... 358/160; 307/293; 328/155; 328/162; 358/162
[58] Field of Search .................. 178/7.1, DIG. 25; 325/9–11; 328/155, 56, 55; 358/160, 162; 307/293

[56] References Cited

U.S. PATENT DOCUMENTS

| | | | |
|---|---|---|---|
| 2,957,042 | 10/1960 | Gibson et al. | 178/DIG. 25 |
| 3,705,952 | 12/1972 | Diehl | 178/DIG. 25 |
| 3,843,930 | 10/1974 | Burnsweig | 328/155 |
| 3,925,608 | 12/1975 | Mollet | 178/7.1 |

*Primary Examiner*—John C. Martin
*Assistant Examiner*—Mitchell Saffian
*Attorney, Agent, or Firm*—Wenderoth, Lind & Ponack

[57] ABSTRACT

A delay circuitry for producing a delayed signal the gain of which is stable irrespective of drift and fluctuation of the delay time of a delay line employed therein, which drift and fluctuation are caused by the changes in the conditions around the delay line.

In this circuitry, a carrier signal is modulated with an input signal and the modulated carrier signal is then delayed in the delay line, the delay time of which is unstable due to the conditions around the delay line. The modulated and delayed carrier signal is detected by a synchronous detector with a reference signal, the phase of which is adjusted so that it is always in phase with the modulated and delayed carrier signal to produce the delayed signal which is stable irrespective of the drift and the fluctuation of the delay time.

20 Claims, 16 Drawing Figures

DELAY CIRCUITRY

BACKGROUND OF THE INVENTION

This invention relates to a delay circuitry and more particularly to a delay circuitry employing a delay line, such as a supersonic delay line, a delay time of which is unstable due to the conditions around the delay line.

A delay circuitry employing a supersonic delay line is used, for example, in a vertical aperture correction apparatus. In such a circuitry, a carrier signal generated in a carrier signal generator is modulated by an amplitude modulator with a video input signal and the modulated carrier signal is delayed through the supersonic delay line by one horizontal scanning period. The delayed video signal is obtained by detecting the modulated and delayed carrier signal with the carrier signal from the carrier generator in a synchronous detector.

Since the delay time of the supersonic delay line is not stable, but changes especially in accordance with the temperature therearound, the supersonic delay line should be soaked in a constant temperature oven to prevent any change of the delay time, if it is required to stabilize the gain of the delay circuitry. This method is effective if the carrier signal frequency is not very high. But with an increase of the carrier signal frequency, the gain becomes less stable, even if the temperature change is limited by the constant temperature oven. In a system in which the video signal has a bandwidth of about 30 MHz and a carrier frequency of about 100 MHz is required, such a delay circuitry utilizing the constant temperature oven according to the prior art cannot be used as the 1H-delay line for the vertical aperture correction apparatus because of the reduced stability of the gain of the delayed video signal. Moreover, such a delay circuitry requires the space for the constant temperature oven.

SUMMARY OF THE INVENTION

An object of the invention is, therefore, to provide a delay circuitry which is adapted for delaying a broadband video signal.

Another object of the invention is to provide a delay circuitry the gain of which is stable irrespective of the change of the temperature therearound which causes drift and fluctuation of the delay time of the delay line employed therein.

A further object of the invention is to provide a delay circuitry which does not require a bulky constant temperature oven.

According to this invention, the carrier signal is amplitude-modulated with the input video signal and delayed through the delay line such as a supersonic delay line. The delayed video signal is obtained by demodulating the modulated and delayed carrier signal by a synchronous detector with a reference signal, the phase of which is adjusted to be in phase with the modulated carrier signal by detecting the phase difference between the modulated carrier signal and the reference signal, so that the gain of the delayed video signal will not be affected by the drift and the fluctuation of the delay time of the delay line.

In one embodiment of this invention, the reference signal is produced from the carrier signal generated in the carrier signal generator through a variable phase shifter which shifts the phase of the carrier signal properly in accordance with a detection voltage representing the phase difference between the modulated and delayed carrier signal and the reference signal so that they are always in phase.

In another embodiment of the phase of the invention, the carrier signal is shifted in accordance with the detection voltage and then modulated by the video signal and delayed. The modulated and delayed carrier signal is demodulated by the synchronous detector with the reference signal which is produced from the carrier signal and is in phase with the delayed modulated carrier signal.

In a further embodiment of the invention, a reference pulse signal is superposed upon the video signal in the horizontal blanking period. The carrier signal is amplitude-modulated with the superposed video signal and delayed, and then demodulated by a synchronous detector with a reference signal. The reference pulse signal is extracted from the demodulated video signal, then its amplitude is detected to produce the detection voltage with which the phase of the reference signal or the carrier signal is adjusted properly so that the gain of the pulse signal will always be constant.

The above and other objects, features and advantages will become readily apparent from the following description of some practical embodiments of the invention.

DESCRIPTION OF THE PREFERRED EMOBIDMENTS

Figures 1, 2A, 2B, 4:
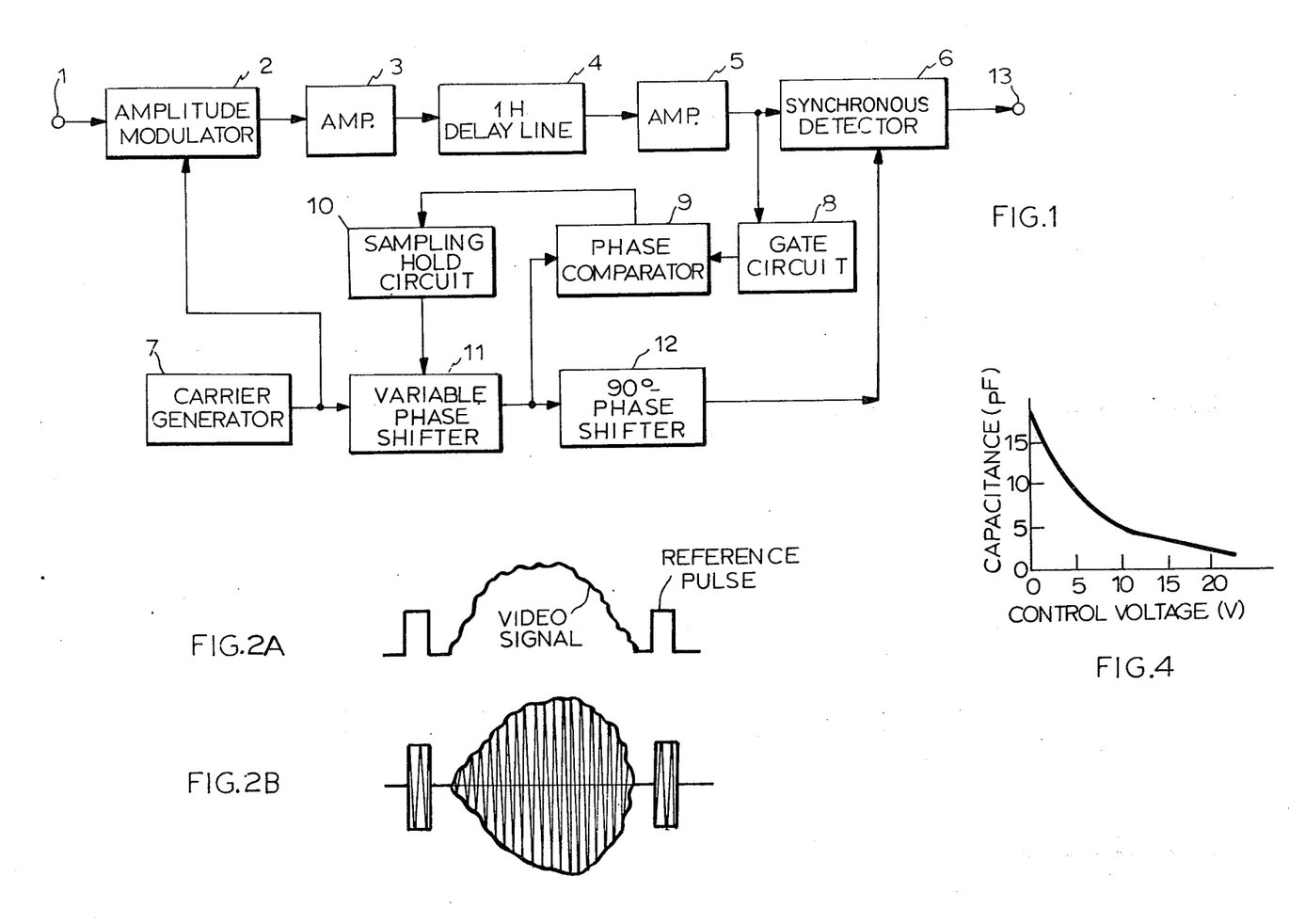
FIG. 1 is a block diagram of the first embodiment of a delay circuitry according to this invention.
FIG. 2A and FIG. 2B are diagrams of a video signal and an amplitude-modulated carrier signal in the delay circuitry of FIG. 1.
FIG. 4 is a diagram for showing the characteristic of a variable capacitor diode employed in the variable phase shifter in FIG. 1.

In a first embodiment of the invention, shown in FIG. 1 a video input signal which is to be delayed and upon which a reference pulse signal has been superposed in the blanking period thereof as shown in FIG. 2A is supplied through an input terminal 1 to an amplitude modulator 2, such as a balanced modulator, where a carrier signal generated in a carrier signal generator 7 is amplitude-modulated with the video signal. The modulated carrier signal, as shown in FIG. 2B, is amplified in an amplifier 3, delayed through a supersonic delay line (1H-delay line) 4 by one horizontal period in this case and amplified by an amplifier 5, and then demodulated by a synchronous detector 6 with a reference signal to produce a 1H-delayed video signal which is derived through an output terminal 13. One part of the modulated and delayed carrier signal which is modulated with the reference pulse signal is extracted by a gate circuit 8 and provided to one input terminal of a phase comparator 9. On the other hand, the carrier signal from the carrier signal generator 7 has its phase properly set by a variable phase shifter 11 in accordance with a control voltage from the phase comparator 9, then provided to another input terminal of the phase comparator 9. The control voltage representing the phase difference between the modulated and delayed carrier signal and the reference signal is obtained there by comparing the phases thereof and is used to shift the phase of the carrier signal from by the carrier signal generator 7, so that the shifted carrier will always lag by 90° in comparison with the modulated carrier. A sampling hold circuit 10 is utilized to maintain the desirable shifting condition throughout the scanning period of the video signal. The phase adjusted carrier signal then has its phase advanced by 90° through a phase shifter 12 to produce the phase tracked reference signal which is always in phase with the modulated and delayed carrier signal, so that the gain of the synchronous detector 6 will always be a maximum.

Figure 3:
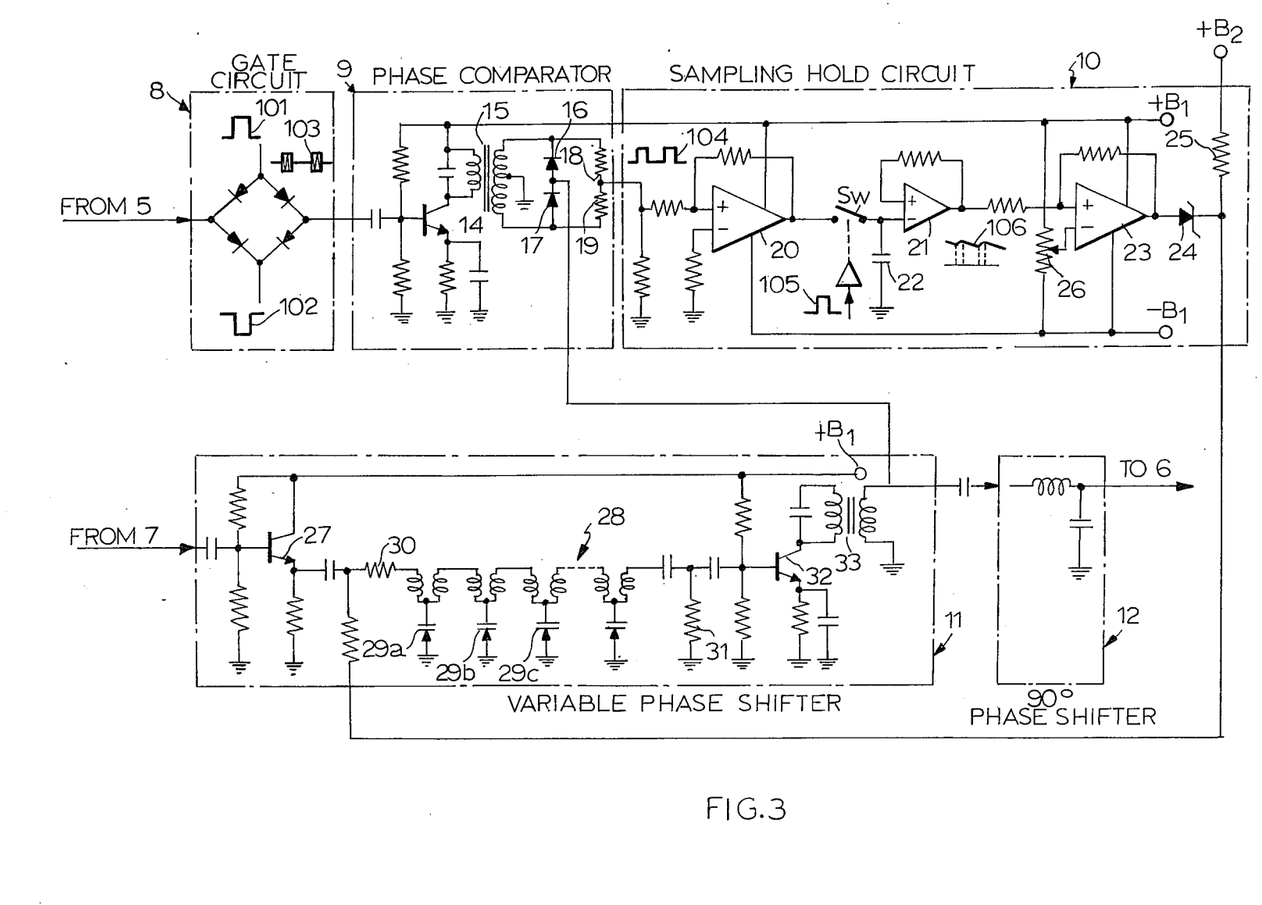
FIG. 3 is a circuit diagram showing the principal part of the delay circuitry of FIG. 1.

FIG. 3 is a schematic circuit diagram showing an example of a phase control circuit loop in the delay circuitry of FIG. 1. In FIG. 3, the delayed carrier signal modulated with the reference pulse signal is extracted from the modulated and delayed signal by the gate circuit 8 constituted by a conventional diode bridge circuit activated by positive and negative pulses 101 and 102 which are synchronized with the input video signal. The extracted carrier signal such as shown at 103 is amplified by a transistor 14 in the phase comparator 9 and provided to a primary winding of a transformer 15, a center tap of the secondary winding of which is grounded, to generate two carrier waves having the same amplitude but opposite polarities to each other at the opposite ends of the secondary winding. The phase comparator 9 can be constituted by a conventional phase detector comprising the transformer 15, resistances 18 and 19 and two diodes 16 and 17 to the connection point of which the carrier signal from the variable phase shift 11 is supplied. The detected output is set so as to be zero when the phase relationship of the modulated carrier signal to the delayed carrier signal is 90° ahead, and to be positive and negative in response to any increment or decrement from such a phase relationship. The detected output such at shown as 104 is amplified by an operation amplifier 20 and converted to a DC voltage through a high input impedance amplifier 21 and capacitor 22. When a gate pulse 105 appears, a switch $S_w$ is closed and the capacitor 22 is charged with the output voltage of the amplifier 20. This voltage is held until the next detection pulse is provided after the gate pulse 105 goes to zero and the switch is opened, because of the high input impedance of the amplifier 21. Since the gate pulse 105 appears simultaneously with the aforesaid gate pulses 101 and 102 and the pulse width thereof is slightly shorter than those of pulses 101 and 102, only the peak voltage of the detection output 104 is derived as the output 106 of the amplifier 21. The DC output voltage 106 is then amplified by the DC amplifier 23 and the variable range thereof is shifted suitably by a zener diode 24, a resistance 25 and a DC voltage source $+B_2$, to produce a control voltage for the variable phase shifter 11. For example, the DC amplifier 23 may have a variable range of about $-V_{B1}$ to $+V_{B1}$, where $-V_{B1}$ and $+V_{B1}$ indicate the negative and positive DC voltage of the voltage sources, $-B_1$ and $+B_1$, respectively. In this case, the voltage range of the control voltage becomes almost $(V_{B1} - V_Z)$ to $(V_{B1} + V_Z)$, where $V_Z$ is the voltage between the two electrodes of the zener diode 24.

Though it is also possible to utilize a smoothing circuit for smoothing the detected output 104 from the phase comparator 9 to produce such a detected voltage in place of the sampling hold circuit 10, such a means is disadvantageous in comparison with the sampling hold circuit, because only a few tenths of the peak value of the detection output 104 contributes to the voltage value of the detection voltage.

In the variable phase shifter 11, the carrier signal from the carrier signal generator 7 is supplied to the emitter follower 27 and delayed through a derived m-type delay line 28, the delay time of which is adjusted suitably by controlling the capacitance of the respective capacitor diodes 29(a), 29(b), 29(c)—, each of which has characteristic such as shown in FIG. 4, in accordance with the control voltage from the zener diode 24. Resistances 30 and 31 are for impedance matching of the delay line 28. The delayed carrier signal is amplified by an amplifier 32 and derived through a transformer 33. It is supplied to the phase comparator 9, and to the 90° — phase shifter 12 as well to produce the phase tracked reference signal utilized to demodulate the 1H-delayed video signal. The phase relationship between the modulated carrier signal from the gate circuit 8 and the phase adjusted carrier signal from the variable phase shifter 11 is adjusted to be a 90° phase difference by setting a variable resistance 26 in the DC amplifier 23 at the standard state. The phase of the reference signal is adjusted by the phase shifter 12, so that it will be substantially in phase with that of the modulated carrier signal.

If the phase of the modulated carrier signal is ahead more than 90° in comparison with that of the shifted carrier signal, for instance, because of a change in the temperature of the 1H-delay line 4, positive pulses appear as the detected output 104 and the higher the control voltage becomes.

The increase of the control voltage results in the decrease of the capacitance of each variable capacitor diode which has a characteristic as shown in FIG. 4, and therefore a reduction of the delay time of the variable phase shifter 11. Consequently, the carrier signal is caused to advance until the phase difference returns to 90°. On the contrary, if the phase of the modulated carrier lags, negative pulses appear as the detected output. This results in a decrease of the control voltage, and therfore an increase of the delay time. The carrier signal is delayed until the phase difference becomes 90°. Since the phase difference between the modulated carrier signal and the shifted carrier signal from the variable phase shifter 11 is maintained always 90° in such a manner, the phase relationship between the modulated carrier signal and the reference signal is kept in phase, and the 1H-delayed video signal, that is the output of the synchronous detector 6 is stable independantly of the drift and the fluctuation of the delay time of the 1H-delay line 4.

In the phase control circuit loop shown in FIG. 3, the phase delay $\theta$ in radians per one delaying element which has an inductance L in henries and a capacitance C in farads is expressed as $\theta = 2\pi f \sqrt{LC}$, where $f$ is the frequency of the carrier signal in cycles. On the assumption that the characteristic of each variable capacitor diode is given as $C = K V^{-3/2}$ for simplification, where V is the amplitude of the control voltage in volts, $\theta$ is expressed as $\theta = 2\pi f \sqrt{LC} V^{-3/2}$. Therefore, the gross phase delay $\text{Ⓗ}$ throughout the variable phase shifter 11 is such as shown in FIG. 5.

Figure 5:
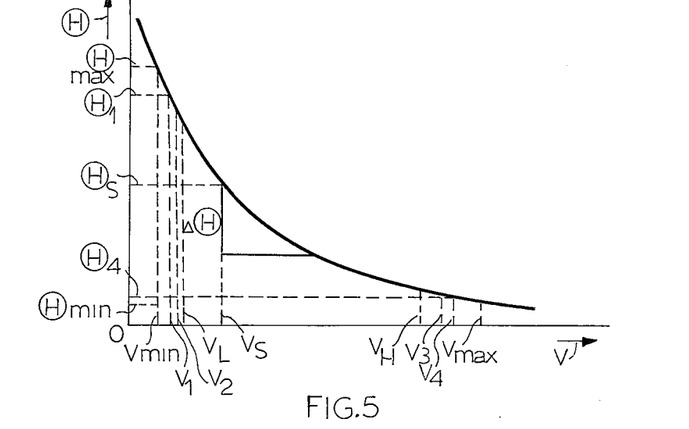
FIG. 5 is a diagram for showing the characteristic of the variable phase shifter in FIG. 1.

$V_s$ and $\text{Ⓗ}_s$ in FIG. 5 indicate the control voltage and the gross phase delay which provide the aforesaid phase relationship between the modulated carrier signal and the delayed carrier signal at the standard state, $H_{max}$ and $V_{min}$ indicate the maximum and minimum phase delay according to the minimum and maximum control voltage $V_{min}$ and $V_{max}$, respectively, and $\Delta\text{Ⓗ}$ and $\Delta V$ indicate the gross phase shift from $\text{Ⓗ}$ and the voltage shift of the control voltage from $V_s$ which are required to maintain such a phase relationship in a certain condition. In this phase control circuit loop, it is necessary to employ a number of delaying elements in order to obtain a sufficient phase shift range.

Figure 6:
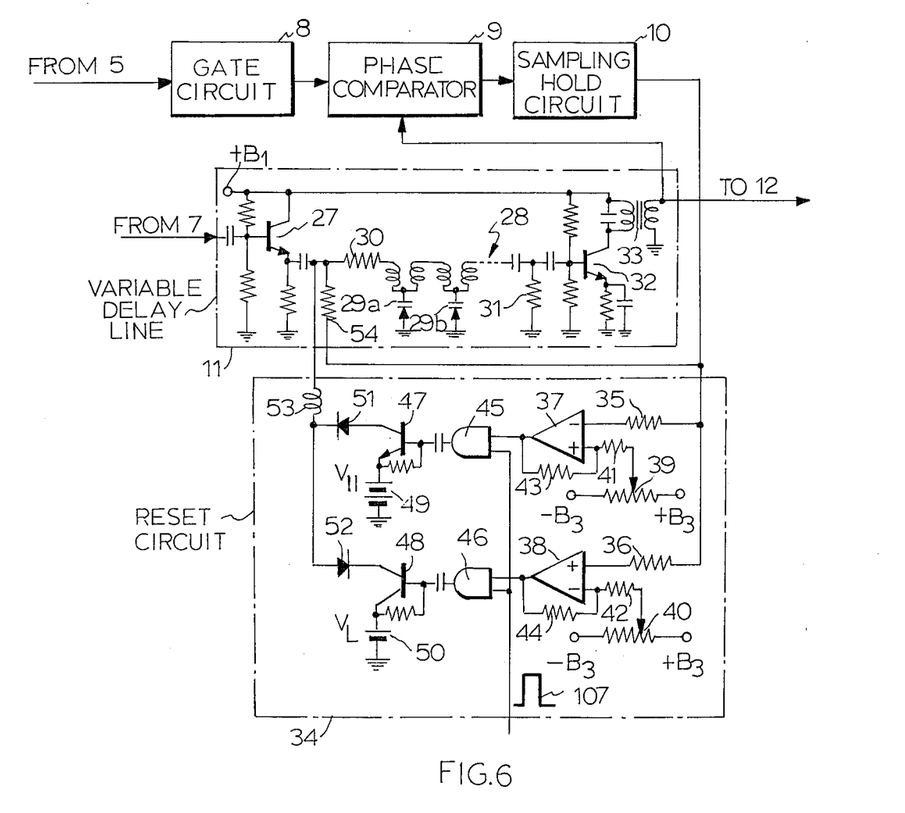
FIG. 6 is a circuit diagram showing the principal part of a second embodiment of a delay circuitry according to this invention.

FIG. 6 shows another phase control circuit loop having a sufficient wide shift range, e.g. more than one period of the video signal, to maintain the desired phase relationship difference of 90°.

The phase control circuit loop of FIG. 6 includes a reset circuit 34 in addition to the circuit loop of FIG. 3, which resets the former control voltage when it tends to exceed Vmin or Vmax in FIG. 5 to hold the phase shift through the variable phase shifter 11 always within the controllable shift range, that is $(\text{Ⓗ}_{max} - \text{Ⓗ}_{min}) > 360°$. In this loop the control voltage from the sampling hold circuit 10 is provided to the first input terminal of each operation amplifier 37 or 38 through a resistance 35 or 36. To the second input terminal of the amplifier 37 is supplied a reference voltage $V_1$ which is determined by a variable resistance 39 connected between a positive voltage source $+B_3$ and a negative voltage source $-B_3$. On the other hand, to the second input terminal of the amplifier 38, a reference voltage $V_4$ is provided, which is determined by a variable resistance 40 connected between the same voltage sources $+B_3$ and $-B_3$. The reference voltage $V_1$ is selected so as to be higher than the minimum control voltage $V_{min}$, and the reference voltage $V_4$ is selected to be lower than the maximum control voltage $V_{max}$ as shown in FIG. 5. The output terminals of the operation amplifiers 37 and 38 are connected to the first input terminals of AND gates 45 and 46, and also to the second input terminals of the respective amplifiers through feedback resistances 43 and 44, respectively. To the respective second input terminals of the AND gates 45 and 46 is supplied a periodic pulse 107 such as a vertical drive pulse for synchronizing a vertical deflection of the video signal reproducing system.

When the control voltage is within the voltage range $V_1 \sim V_4$, the outputs of both operating amplifiers 37 and 38 are negative or below the threshold voltages of the AND gates 45 and 46. But when the control voltage becomes lower than $V_1$, the output of the operation amplifier 37 changes into a positive voltage, therefore the AND gate 45 produces a positive drive pulse in response to the periodic pulse 107 to turn on a switching transistor 47. As a result, a certain voltage $V_H$ from the constant voltage source 49 appears at the collector electrode of the switching transistor 47, and it is supplied through a diode 51 and a choke coil 53 to the output terminal of the variable phase shifter 11 where the control voltage from the sampling hold circuit is supplied through a resistance 54. Since the control voltage is clamped at $V_H$ which is lower than $V_4$ but larger than $V_s$, the desired phase relationship is accomplished at a certain voltage within the possible control voltage range according to the succeeding modulated carrier signal.

On the other hand, when the control voltage becomes higher than $V_4$, the output of the operation amplifier 39 changes to a positive voltage, and the AND gate 46 produces a positive drive pulse in response to the periodic pulse 107 to turn on a switching transistor 48 and therefore a diode 52. As a result, since the control voltage is clamped at $V_l$ from a constant voltage source 50, which is higher than $V_1$ but lower than Vs, the desired phase relationship is accomplished at a certain voltage within the possible control voltage range according to the succeeding modulated carrier signal.

In order to improve the reliability of the reset circuit, the operation amplifiers 37 and 38 have hysteresis characteristics such that the positive output voltages thereof are reset in accordance with the control voltages such as $V_2$ and $V_3$ which are higher than $V_1$ and lower than $V_4$, respectively, by a few volts. For this purpose, the output voltages of the operation amplifier 37 and 38 are fed back to the second input terminals of the amplifier through the resistances 43 and 44, respectively. Accordingly, even if the control voltage changes slowly near the threshold voltage of the operation amplifiers 37 and 38, they operate much more accurately than those without such hysteresis characteristics.

In the above description, the possible shift range of the variable phase shifter 11 without such resetting of the control voltage is $(\text{Ⓗ}_1 - \text{Ⓗ}_4) > 360°$, where $H_1$ and $\text{Ⓗ}_4$ are the gross phase delays corresponding to the control voltages $V_1$ and $V_4$, respectively. The phase relationship between the modulated carrier signal and the adjacent carrier signal from the carrier signal generator 7 after such resetting of the former control voltage is controlled firstly in accordance with the clamp voltage $V_L$ or $V_H$, and then adjusted to be the desired phase relationship that is 90° phase difference.

Figures 7A, 8:
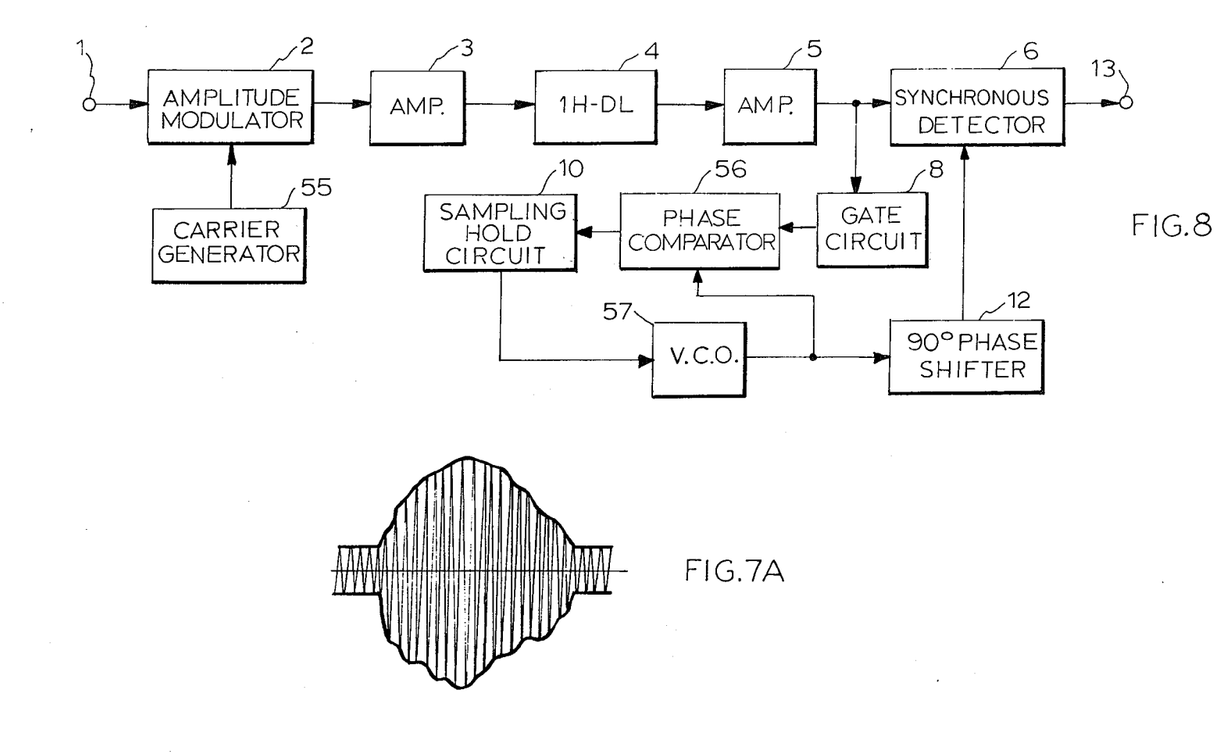
FIG. 7A and FIG. 7B are diagrams of the other examples of wave shapes of the modulated carrier signal.
FIG. 8 is a block diagram of a third embodiment of a delay circuitry according to this invention.
Figure 7B:
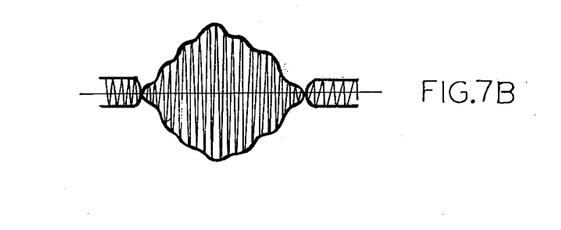

The wave shape of the modulated carrier signal from the amplitude modulator 2 is not restricted to that shown in FIG. 2B, that is of 100%-modulation. Under-modulation and over-modulation methods can be also used, the wave shapes for which are shown in FIG. 7A and FIG. 7B, respectively. With either method, the superposition of the reference pulse signal upon the input video signal is not required. Moreover, if the under-modulation method is used, the gate circuit 8 may be replaced by a limiter for deriving a continuous modulated carrier signal of constant amplitude, and the sampling hold circuit 10 may be omitted because the control voltage is derived directly from the output of the phase comparator such as 9.

FIG. 8 shows a third embodiment of this invention having a voltage controlled oscillator for generating a phase tracked reference signal by which the delayed video signal is detected. In FIG. 8, the constitutions of the circuits designated by 1~6, 8, 10 and 12 are same as the corresponding circuits of FIG. 1. The carrier signal generated in a carrier signal generator 55 is amplitude-modulated with the input video signal in the same way as in the delay circuitry of FIG. 1. The modulated carrier signal is extracted by the gate circuit 8 at the reference pulse signal portion and its phase is compared with that of a carrier signal generated by a conventional voltage controlled oscillator 57 in a phase comparator 56 which has the same construction as the phase comparator 9 of FIG. 3, except that the carrier signal from the voltage controlled oscilator 57 is supplied to the connection point of the two diodes 16 and 17 instead of the carrier signal from the variable phase shifter 11. The control voltage is produced in the sampling hold circuit 10 from the detected output from the comparator 56, and it is utilized to control the voltage controlled oscillator 57. The phase of the carrier signal from the voltage controlled oscillator 57, which is adjusted with the control voltage so as to lag by 90° the modulated and delayed carrier signal, then has the phase thereof advanced by 90° by the 90°-phase shifter 12 to produce the reference signal. Since the reference signal is always in phase with the modulated and delayed carrier signal from the amplifier 5, the delayed video signal which is obtained as the output of the synchronous detector 6 is stable irrespective of the drift and fluctuation of the delay time of the 1-H delay line 4.

It is obviously possible to accomplish such constant phase relationship by controlling the phase of the carrier signal which is amplitude-modulated with the input video signal in accordance with the control voltage from the sampling hold circuit 10, for instance, instead of controlling the phase of the reference signal as described before.

In this case, the variable phase shifter such as 11 in FIG. 1 should be connected between the carrier signal generator 7 and the amplitude modulator 2, to which variable phase shifter 11 the control voltage is supplied, and the reference signal utilized to detect the modulated carrier signal should be produced from the carrier signal generator 7 through the 90°-phase shifter 12.

Figure 9:
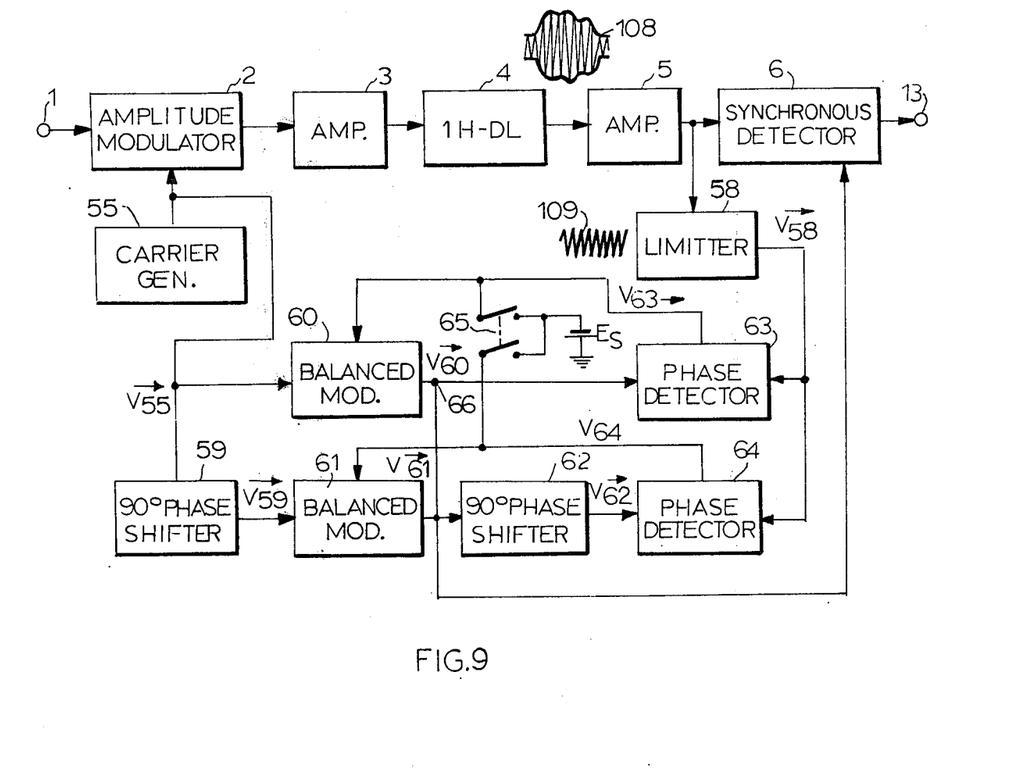
FIG. 9 is a block diagram of a fourth embodiment of this invention.

The fourth embodiment, shown in FIG. 9, provides a delay circuitry in which only one carrier signal generator is employed and the phase tracked reference signal the phase of which is adjusted so as to be always in phase with that of the modulated and delayed carrier signal is derived from the carrier signal generated in the carrier signal generator without the variable phase shifter such as 11 in FIG. 1. In this circuitry, the carrier signal from the carrier signal generator 55 is amplitude-modulated with the input video signal by under-modulation such as shown in FIG. 7A, and the modulated and delayed carrier signal 108 is supplied to a limiter 58 to produce a continuous signal 109 which has the same phase and the same frequency as the modulated carrier signal 108. The carrier signal from the carrier generator 55 is also supplied to a balanced modulator 60 and to another balanced modulator 61 through a 90°-phase shifter 59 to modulate detected outputs $V_{63}$ and $V_{64}$ of phase detectors 63 and 64, respectively. The two output terminals of the balanced modulators 60 and 61 are connected together to produce a mixed signal. The phase detectors 63 and 64 detect the continuous signal from the limiter 58 with the mixed signal and the output of a 90° phase shifter 62, respectively. The phase tracked reference signal is obtained from the mixed signal and used to demodulate the delayed video signal in the synchronous detector 6.

Figure 10:
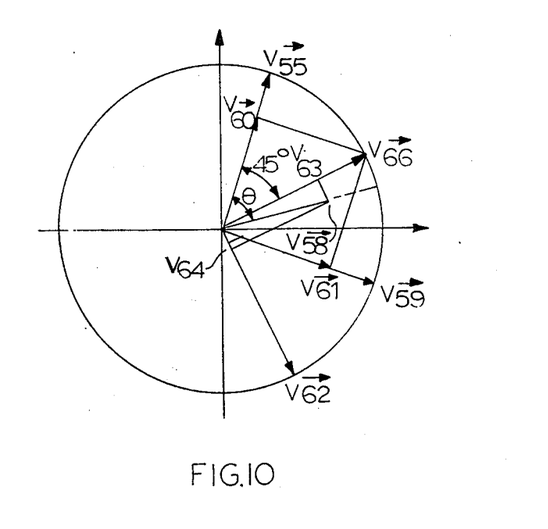
FIG. 10 is a vector diagram for showing the operation of the delay circuitry of FIG. 9.

At the start of the operation of this circuitry, a switch 65 is closed to provide a DC voltage Es to both balanced modulators 60 and 61. The outputs of the balanced modulators 60 and 61, designated as vectors $\vec{V}_{60}$ and $\vec{V}_{61}$, appear when the switch 65 is closed, the output $\vec{V}_{60}$ being in phase with the carrier signal, designated as vector $\vec{V}_{55}$, from the carrier signal generator 55, and the output $\vec{V}_{61}$ lagging the carrier $\vec{V}_{55}$ by 90°, but having the same amplitude as the output $\vec{V}_{60}$ as shown in the vector diagram of FIG. 10. Since the output terminals of the balanced modulators 60 and 61 are connected together, the mixed signal $\vec{V}_{66}$ which appears at the connection point 66 is the sum of the vector $\vec{V}_{60}$ and the vector $\vec{V}_{61}$ as shown in FIG. 10. The continuous signal $\vec{V}_{58}$ from the limiter 58 is detected by the mixed signal $\vec{V}_{66}$ and the 90°-phase-shifted mixed signal $\vec{V}_{62}$ in the phase detectors 63 and 64 to generate the DC detection voltages $V_{63}$ and $V_{64}$, respectively. Assuming that the phase difference between the carrier $\vec{V}_{55}$ and the modulated carrier signal 108, therefore the continuous signal $\vec{V}_{58}$ is $\phi$, the detection voltages $V_{63}$ and $V_{64}$ in this initial condition are $V_{63} = |\vec{V}_{58}| \cos(\phi - 45°)$ and $V_{64} = |\vec{V}_{58}| \sin(\phi - 45°)$. In the next step, the carrier signal $V_{55}$ and the 90°-phase-shifted carrier $V_{59}$ are modulated with these two detection voltages $V_{63}$ and $V_{64}$ in the balanced modulators 60 and 61, respectively. By repetition of these steps, the mixed signal $\vec{V}_{66}$, that is the reference signal, is adjusted so that the phase thereof is the same as that of the continuous signal 109 or the modulated carrier signal 108. Since the reference signal is given as the vector summation, the desired phase relationship between the reference signal and the modulated carrier signal 108, that is an in phase relationship, is retained despite any fluctuation or change of phase in the modulated carrier signal 108 which originates in the change of the delay time of the 1H-delay line 4 even if it is more than one period of the video signal.

Figure 11:
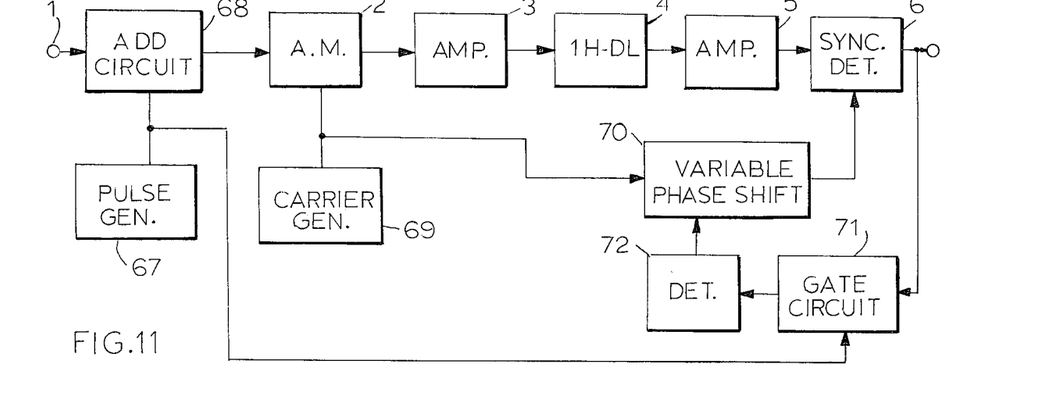
FIG. 11 is a block diagram of a fifth embodiment of this invention.

FIG. 11 shows a fifth embodiment of the invention, where the phase difference between the modulated and delayed carrier signal and the reference signal is detected by detecting the demodulated level of a reference pulse signal which is inserted in the blanking period of the input video signal such as shown in FIG. 2A. In this circuitry, the reference pulse signal from a pulse generator 67 is superposed upon the input video signal in an adding circuit 68, and the carrier signal from the carrier signal generator 69 is modulated with the output of the adding circuit 68 in the same way as in the aforementioned embodiments. The carrier signal which is delayed through the supersonic 1H-delay line 4 is demodulated in the synchronous detector 6 with the reference signal produced from the carrier signal from the carrier signal generator 69 through a variable phase shifter 70, such as 11 in FIG. 1. The reference pulse signal is extracted from the output of the synchronous detector 6 with the reference pulse signal from the pulse generator 67 through a gate circuit 71 and then detected by a conventional amplitude detector 72 to produce a control voltage the amplitude of which is proportional to the amplitude of the reference pulse signal and, therefore, is inversely proportional to the phase difference between the modulated carrier signal and the reference signal. Then the delay time of the variable phase shifter 70 is adjusted so that the amplitude of the reference pulse signal is a maximum to maintain the gain of the synchronous detector 6 at a maximum.

With this circuitry, the phase comparator 9 or 56 in FIG. 1 or FIG. 8 is unnecessary to detect the phase difference, because the amplitude of the reference signal extracted by the gate circuit 71 from the output of the synchronous detector 6 represents such phase difference. But, there is no way to discriminate between the lag or the lead of the modulated carrier signal relative to the reference signal in this circuitry, and therefore, the variable phase shifter 70 should function such that the delay time thereof only increase (or decrease) in response to the decrement (or increment) of the control voltage from the amplitude detector 72 which results in a slow response. To get rid of these disadvantages a further embodiment, shown in FIG. 12, can be provided.

Figure 12:
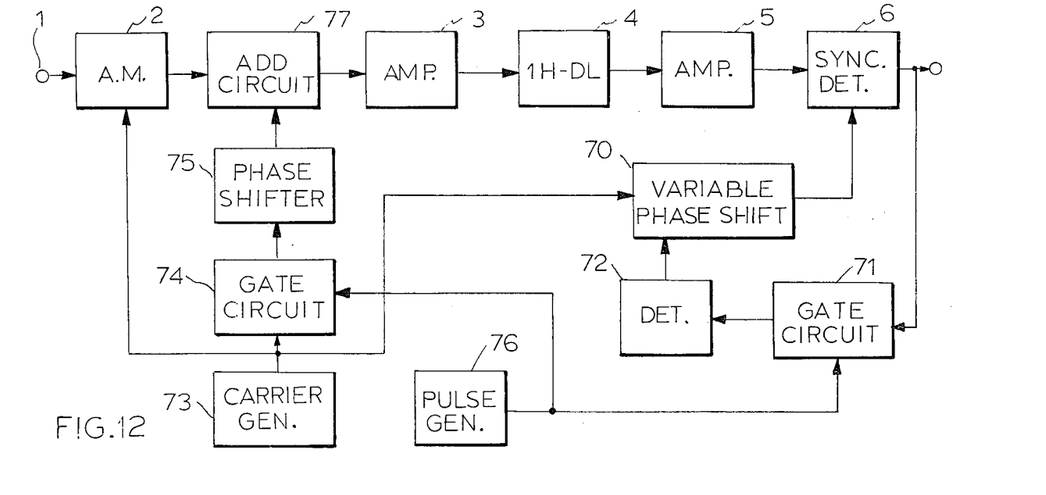
FIG. 12 is a block diagram of a further embodiment of the delay circuitry of the invention.
Figure 13A:
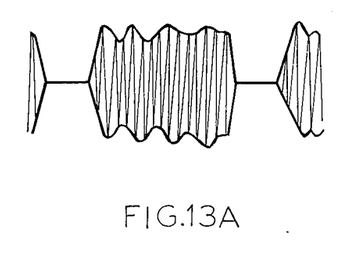
FIG. 13A and FIG. 13B are diagrams showing modulated carriers in a video signal period and in a reference pulse signal period which are superposed together in the circuitry of FIG. 12.
Figure 13B:
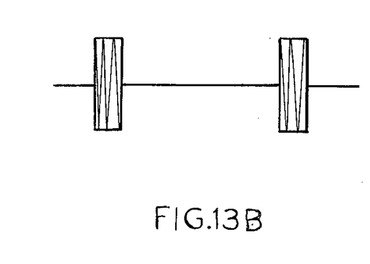

In FIG. 12, the carrier signal generated in the carrier signal generator 73 is gated with the reference pulse signal from the pulse generator 76 in the gate circuit 74 and has the phase thereof advanced by 90° as shown in FIG. 13B in the 90°-phase shifter 75, and then is, mixed in the adding circuit 77 with the modulated carrier signal which is shown in FIG. 13A. The reference signal is obtained from the carrier signal through the variable phase shifter 70 in the same manner as in the above-described embodiments.

Since the phase of the carrier signal is varied by 90° between the reference pulse signal period and the video signal period, the reference pulse signal should be always zero when the reference signal and the modulated carrier signal in the video signal period are in phase with each other. Therefore, the delay time of the variable phase shifter 70 is controlled so that the reference pulse signal will be zero to produce the delayed video signal the gain of which is always maximum irrespective of the drift of the delay time of the delay line 4.

In FIG. 12, the gate circuit 71 has the same constitution as the gate circuit 8 in FIG. 3, and the amplitude detector 72 can be constituted by the common integrating circuit, the DC amplifier and voltage range shifter such as shown in FIG. 3. Although this circuitry does not utilize a phase comparator or phase detector for detecting the phase difference between the modulated carrier and the reference signal, it operates is substantially in the same manner as the circuitry in FIG. 1 or FIG. 3 because such a phase difference is detected in the synchronous detector 6.

Although this invention has been particularly shown and described, it is contemplated that various changes and modifications may be made without departing in any way from the scope of this invention as set forth in the following claims. The embodiments of the invention in which an exclusive property or privilege is claimed are defined as follows:

We claim:

1. A delay circuitry comprising
carrier signal generating means;
modulating means coupled to said carrier signal generating means for modulating the carrier signal from said carrier signal generating means with an input signal;
delaying means coupled to said modulating means for delaying the modulated carrier signal from said modulating means and in which drift or fluctuation of the delay time may occur;
demodulating means coupled to said delaying means for demodulating the modulated and delayed carrier signal from said delaying means with a demodulating signal to produce a delayed signal;
first circuit means coupled to said delaying means and said demodulating means for detecting the phase difference between said demodulating signal and said modulated and delayed carrier signal to generate a detected voltage; and
second circuit means coupled to said first circuit means and being responsive to said detected voltage and also coupled to the carrier signal generating means for controlling the phase relationship between said demodulating signal and said modulated and delayed carrier signal so as to be constant, whereby the delayed signal is not affected by drift or fluctuation of the delay time which may occur in said delaying means.

2. A delay circuitry as claimed in claim 1 wherein said second circuit means comprises a variable phase shifting means coupled between said carrier signal generating means and said demodulating means for responding to said detected voltage from said first circuit means for shifting the phase of said carrier signal from said carrier signal generating means to produce said demodulating signal in accordance with said detected voltage.

3. A delay circuitry as claimed in claim 1 wherein said carrier signal generating means is coupled to said demodulating means for supplying the carrier signal thereto as the demodulating signal, said second circuit means comprises a variable phase shifting means which is further coupled to said carrier signal generating means for shifting the phase of said carrier signal in accordance with said detected voltage from said first circuit means, and said modulating means being connected to said variable phase shifter and comprising means for modulating the phase shifted signal from said variable phase shifter, so that said modulated and delayed carrier signal is in phase with said reference signal.

4. A delay circuitry as claimed in claim 1, wherein said demodulating means comprises phase shifting means coupled to said second circuit means for shifting the phase of said demodulating signal by a predetermined amount to produce a reference signal and synchronous detecting circuit means coupled to said delaying means and said phase shifting means for detecting said modulated and delayed carrier signal with said reference signal to produce the delayed signal.

5. A delay circuitry as claimed in claim 1 wherein said first and second circuit means comprises:
a circuit for responding to said modulated and delayed carrier signal to produce a continuous signal having the same phase and frequency as said modulated and delayed carrier signal;
a first phase shifter coupled to said carrier signal generating means for shifting the phase of said carrier signal generated in said carrier signal generator;
a first and second modulator coupled to said carrier signal generating means and said first phase shifter for modulating said carrier signal and a phase shifted carrier signal from said first phase shifter with first and second detection voltages, respectively, said modulators having output terminals which are connected together to produce a reference signal;
a second phase shifter coupled to said output terminals for shifting the phase of the signal obtained at the connection point of said output terminals of said two modulators;
a first phase detector coupled to said circuit and said second phase shifter for detecting the phase difference between said signal from said connection point and said continuous signal from said circuit to produce said first detection voltage, the output of the first phase detector being coupled to said first modulator; and a second phase detector coupled to said second phase shifter and said circuit for detecting the phase difference between the output of said second phase shifter and said continuous signal to produce said second detection voltage, the output of said second phase detector being coupled to said second modulator, whereby the reference signal obtained at said connection point of said output terminals of said two modulators is in phase with said modulated and delayed carrier.

6. A delay circuitry as claimed in claim 5 wherein said first and second phase shifters are 90° phase shifters.

7. A delay circuitry as claimed in claim 1 wherein said second circuit means comprises a variable phase shifter coupled to said carrier signal generating means for shifting the phase of the carrier signal generated in said carrier generating means in accordance with said detected voltage from said first circuit means and a reset circuit coupled to said variable phase shifter for resetting said detected voltage when the phase difference between said reference signal and said modulated and delayed carrier signal exceeds a predetermined value.

8. A delay circuitry as claimed in claim 7 wherein said reset circuit comprises:
a first circuit responsive to said detected voltage for producing a first DC voltage which is higher than the lower limit of a controllable voltage range of said variable phase shifter when said detected voltage exceeds a first predetermined voltage near the upper limit of the controllable voltage range;

a second circuit responsive to said detected voltage for producing a second DC voltage which is not higher than said first predetermined voltage when said detected voltage exceeds a second predetermined voltage near the lower limit of the controllable voltage range, which second predetermined voltage is not higher than said first DC voltage; and a third circuit coupled to said first and second circuits for resetting said detected voltage supplied to said variable phase shifter by supplying said first DC voltage or said second DC voltage selectively when said detected voltage exceeds either of said predetermined voltages.

9. A delay circuitry as claimed in claim 8 wherein said first circuit comprises means for resetting said first DC voltage when the detected voltage becomes lower than said first predetermined voltage by a few volts, and said second circuit comprises means for resetting said second DC voltage when the detected voltage becomes higher than said second predetermined voltage by a few volts.

10. A delay circuitry comprising:
carrier signal generating means;
modulating means coupled to said carrier signal generating means for modulating a carrier signal from said carrier signal generating means with an input video signal and a reference pulse signal to produce a modulated signal in which said reference pulse signal is in the blanking period of said video signal;
delaying means coupled to said modulating means for delaying said modulated signal and in which drift or fluctuation of the delay time may occur;
synchronous detecting means coupled to said delaying means for detecting the modulated and delayed carrier signal from said delaying means with a reference signal to produce a delayed video signal;

gate circuit means coupled to said synchronous detecting means for extracting a delayed reference pulse signal from the output of said synchronous detecting means;

first circuit means coupled to said gate circuit for detecting the amplitude of said delayed reference pulse signal from said gate circuit means to produce a detected voltage corresponding to the amplitude of said delayed reference pulse signal; and second circuit means coupled to said first circuit means and to which said carrier signal generating means is connected to supply the carrier signal thereto as a reference signal, said second circuit means being responsive to said detected voltage from said first circuit means for adjusting the phase relationship between said reference signal and said modulated and delayed signal so that they are in phase, whereby the delayed video signal is not affected by drift or fluctuation of the delay time which may occur in said delaying means.

11. A delay circuitry as claimed in claim 10 wherein said modulating means comprises:
a modulating circuit for modulating the carrier signal from said carrier signal generating means with an input video signal;

a reference pulse generating circuit for generating a reference pulse signal;

a carrier signal gating circuit coupled between said reference pulse generating circuit and said carrier signal generating means for gating said carrier signal from said carrier signal generating means with said reference pulse signal; and an adding circuit coupled to the output of said modulating circuit and the output of said circuit signal gating circuit for superposing a gated carrier signal from said carrier signal gating circuit on a modulated carrier signal from said modulating circuit in a blanking period of said video signal to produce said modulated signal in such a manner that the phase difference between said gated carrier signal and said modulated carrier signal is 90° in said modulated signal, and said second circuit means operates so that the amplitude of said delayed reference pulse signal is zero at the output of said detecting means.

12. A delay circuitry as claimed in claim 10 wherein said first circuit means comprises a sampling hold circuit for holding the amplitude of said delayed reference pulse signal from said gate circuit means to produce said detected voltage.

13. A delay circuitry as claimed in claim 10 wherein said modulating means comprises:
a first circuit for generating a reference pulse signal;
a second circuit coupled to said first circuit for superposing said reference pulse signal upon an input video signal in a blanking period thereof;
a third circuit coupled to the output of said second circuit and to said carrier signal generating means for modulating said carrier signal from said carrier signal generating means with the output of said second circuit to produce said modulated signal.

14. A delay circuitry for producing a delayed signal comprising:
carrier signal generating means;
modulating means coupled to said carrier signal generating means for modulating the carrier signal generated in said carrier signal generating means with an input signal;

delaying means coupled to said modulating means for delaying the modulated carrier signal from said modulating means and in which drift or fluctuation of the delay time may occur;

demodulating means coupled to said delaying means for demodulating the modulated and delayed carrier signal from said delaying means with a reference signal to produce the delayed signal;

first circuit means coupled to said delaying means for responding to said modulated and delayed carrier signal to produce a first signal having the same phase and frequency as said modulated and delayed carrier signal;

second circuit means coupled to said carrier signal generating means for controlling the phase of said carrier signal therefrom to produce a shifted carrier signal with a detected voltage;

third circuit means coupled to said first circuit means and said second circuit means for detecting the phase difference between said first signal and said shifted carrier signal to produce said detected voltage with which said second circuit means controls the phase of said carrier signal; and phase shifting means coupled to said second circuit means for receiving said shifted carrier signal for shifting the phase thereof to produce said reference signal with which said demodulating means demodulates the modulated and delayed carrier signal from said delaying means to produce the delayed signal.

15. A delay circuitry as claimed in claim 14 wherein said first circuit means comprises a limiter for responding to said modulated and delayed carrier signal to produce a continuous signal as said first signal.

16. A delay circuitry as claimed in claim 14 wherein said second circuit means comprises a variable phase shifter for shifting the phase of said carrier signal in accordance with said detected voltage from said third circuit means to produce the shifted carrier signal, and said third circuit means comprises a phase comparator coupled between said first circuit means and said variable phase shifter for detecting the phase difference between said first signal and said shifted carrier signal to produce said detected voltage.

17. A delay circuitry as claimed in claim 14 wherein said input signal is a video signal, said first circuit means comprises a gate circuit for extracting said modulated and delayed carrier signal in the blanking period of said video signal to produce said first signal.

18. A delay circuitry as claimed in claim 17 wherein said second circuit means comprises a phase detector for detecting a phase difference between said reference signal and said first signal and a sampling hold circuit coupled to said phase detector for holding the amplitude of the output of said phase detector through one period of the video signal to produce said detected voltage.

19. A delay circuitry comprising:

carrier signal generating means;

modulating means coupled to said carrier signal generating means for modulating the carrier signal from said carrier signal generating means with an input signal;

delaying means coupled to said modulating means for delaying the modulated carrier signal from said modulating means and in which drift or fluctuation of the delay time may occur;

demodulating means coupled to said delaying means for demodulating the modulated and delayed carrier signal from said delaying means with a demodulating signal to produce a delayed signal;

first circuit means coupled to said delaying means and said demodulating means for detecting the phase difference between said demodulating signal and said modulated and delated carrier signal to generate a detected voltage; and second circuit means coupled to said first circuit means and comprising a further carrier signal generating means by which a carrier signal is produced, said second circuit means controlling the carrier signal from said further carrier signal generating means in accordance with said detected voltage from said first circuit means for controlling the phase relationship between said demodulating signal and said modulated and delayed carrier signal so as to be constant, whereby the delayed signal is not affected by drift or fluctuation of the delay time which may occur in said delaying means.

20. A delay circuitry as claimed in claim 19, wherein said further carrier signal generating means is a voltage controlled oscillating means coupled to said first circuit means and said demodulating means, the oscillation frequency of which is controlled with said detected voltage to produce said demodulating signal.

* * * * *